(12) United States Patent
Eriksson

(10) Patent No.: US 6,200,630 B1
(45) Date of Patent: *Mar. 13, 2001

(54) PRODUCING A METALLIC LAYER ON THE SURFACE OF A DETAIL FOR SHIELDING AGAINST ELECTROMAGNETIC RADIATION

(75) Inventor: Lars Eriksson, Emmaboda (SE)

(73) Assignee: Telefonaktiebolaget LM Ericsson, Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/142,798

(22) PCT Filed: Mar. 4, 1997

(86) PCT No.: PCT/SE97/00372

§ 371 Date: Oct. 11, 1998

§ 102(e) Date: Oct. 11, 1998

(87) PCT Pub. No.: WO97/34459

PCT Pub. Date: Sep. 18, 1997

(30) Foreign Application Priority Data

Mar. 13, 1996 (SE) ...................................................... 9600967

(51) Int. Cl.[7] ............................... B05D 5/12; B05D 1/28; B05D 1/32
(52) U.S. Cl. .......................... 427/123; 427/261; 427/299; 427/429; 156/292; 264/272.11; 264/272.17
(58) Field of Search ..................................... 427/256, 282, 427/429, 299, 123, 261; 101/129, 211, 492; 156/292; 264/272.11, 272.17

(56) References Cited

U.S. PATENT DOCUMENTS

| | | |
|---|---|---|
| 3,594,490 | 7/1971 | Mitchell et al. ................. 174/35 MS |
| 4,670,347 * | 6/1987 | Lasik et al. . |
| 4,890,199 | 12/1989 | Beutler ................................. 361/424 |
| 5,047,260 * | 9/1991 | Durand . |
| 5,198,154 | 3/1993 | Yokoyama et al. .................. 252/514 |
| 5,543,333 * | 8/1996 | Holdermann . |

FOREIGN PATENT DOCUMENTS

PCT/SE97/00372  9/1997  (WO) .

OTHER PUBLICATIONS

"McGraw Hill Dictionary of Scientific and Technical Terms", 5th Edition p. 1827, 1994.*
"The Silk Screen Printing Process",JI Biegeleisen & EJ Busenbark, 2nd Edition, pp. 6–7, 64–65, 1941.*

* cited by examiner

Primary Examiner—Fred J. Parker
(74) Attorney, Agent, or Firm—Jenkens & Gilchrist, P.C.

(57) ABSTRACT

A layer may be produced on the surface of a detail to thereby provide electromagnetic radiation shielding. The layer (e.g., a metallic layer) is transferred either directly or indirectly onto the detail, which may be all or a portion of, for example, a telephone casing. The transfer may be effectuated through a variety of techniques. For example, a tampon pad may be crafted to conform to the surface of the detail. After the tampon pad is coated by collecting the layer (e.g., from a foundation onto which the layer was pressed through a screen frame or from an etched plate), the layer is transferred to the detail from the tampon pad. Additional examples include transferring the layer by using a screen printing method or by sinking the detail into a fluid bath.

25 Claims, 1 Drawing Sheet

PRODUCING A METALLIC LAYER ON THE SURFACE OF A DETAIL FOR SHIELDING AGAINST ELECTROMAGNETIC RADIATION

BACKGROUND OF THE INVENTION

1. Field of the Invention

The present invention relates in general to the field of producing electromagnetic radiation shielding, and in particular, by way of example but not limitation, to producing electromagnetic radiation shielding in electronic devices with non-flat surfaces.

2. Description of Related Art

In our surroundings there are a large number of electromagnetic fields which are formed by electrical machines and electrical equipment, such as radios, TVs, refrigerators, deepfreezers, stoves, electric ovens, computers, car- and pocket telephones, electrical conductors, power tools, lamps and a number of other devices. These electromagnetic fields, which surrounds us every day, probably cause a number of symptoms for people who are allergic to this radiation, in the form of different allergies, cancers or different types and other complains.

There are today different forms and methods for trying to reduce the effect of the electromagnetic field on people through different types of screening methods.

The electromagnetic radiation can be reduced through shielding the radiating unit with a metallic casing, which can contain the electromagnetic field and thereby reduce the risk of injury to people.

These shielding devices can be made, for example, as an enclosing casing, formed of a net of metal wires or of a metallic foil or from a surface which is metallized through vacuum vaporisation or the structural plastic material in the device can be completely or partially mixed with metal fragments.

The protective effect is thus achieved through placing an obstacle in the radiation direction which shields at least at the place where it is desired to avoid radiation from the electromagnetic field or to shield larger surfaces than that.

To produce this shielding is often expensive and complicated and sometimes does not give an esthetically attractive result. To shield, for example, through clothing the electrical devices with a net or foil does not look nice and furthermore makes it difficult to operate and access them. Internal solutions, such as foils moulded-in or mechanically mounted become both expensive and complicated. If a surrounding casing of plastic is constructed with an electrically conductive material baked into the plastic then the casing becomes unnecessarily heavy and furthermore expensive to produce, since the material cost becomes high and the operating time in an injection mould takes a long time. A vacuum vaporisation method is suitable for producing a surface coating of a thin metallic layer. This method causes problems in the form of difficult handling. First the details must be unpacked. Then comes masking of surface which it is not desired to coat with metal, then hanging up on different stands and then introduction into the autoclave which is then evacuated of air in order to produce a vacuum. It is only after this that the metallization through vacuum vaporisation can take place. Thereafter follows demounting of the metallized details, which will be packaged and transported to the manufacturer of the electrical devices. Vacuum vaporisation plants costs many millions of Swedish crowns which add to the cost for each metallized detail. Metallization which is performed with anodisation has similar disadvantages as the vacuum vaporisation method.

All the above described methods are both time-consuming, labour-intensive and expensive at the same time as the quality of the metallic layer developed is not always sufficiently good.

The present invention is intended to solve the above mentioned problems.

It is known in the prior art to transfer a non-cured or undried paint substance to a foundation from a stamp pad which can be coated with paint in different ways. For example the paint can be pressed through a template against a plate where a picture is etched with the exact shape, spread, thickness and colour. A soft and pliable stamp pad them gets this picture through being pressed against this surface and then transfers this to a pre-determined place on a surface of a detail, for example, a pen, a clockface, a toy or some other detail surface, which can be arched, curved or have another simple surface shape. The picture can also be taken from a screen printed picture. The stamp pad is shaped so that it can follow the different shaped surfaces so that the picture is transferred and covers in the best way the whole of its surface so that no part of the picture is left out. This method is known as "tampon-printing".

SUMMARY OF THE INVENTION

According to the invention the advantages of tampon-printing can be used through exchanging the printing ink for a metallic material which then forms a shielding layer against electromagnetic radiation. According to the invention masking of surfaces which are not to be metallized, for example, the front side, the making of holes, fittings, join surfaces etc. becomes unnecessary as the shape, thickness and extension of the print is regulated exactly with this tampon-printing method. According to the invention, by further refining this known printing method, much more complicated surface shapes can be coated with a metallized layer so that even extremely arched and complicated surfaces with projecting elements or fittings and the like can be coated. The stamp pad can in this case be shaped more exactly so that it in general fits the detail which is to be coated with a layer. One can in this case produce the stamp pad in an extra soft and flexible material so that it can stretch itself into the smallest nook. Smaller details with extremely complicated shapes, for example, car telephone cases, become easier to coat with a layer since the tampon-printing method according to the invention is especially easy to perform on small surfaces. All handling such as placing in or removing out of details for metallization in a vacuum vaporisation method does not have to be performed according to the invention. Injected moulding plastic material with a metal mixed in does not need to be used either. Instead, according to the invention, the structural material which normally is needed for the purposes is used. To place in or glue fast a metal casing also becomes unnecessary, as well as making of different types of nets.

According to the present invention a cheap, quick and particularly easy method of obtaining a metallic layer as a shield against electromagnetic radiation on a detail which is to be used in a electrical device is provided. Furthermore the method according to the invention gives an extremely high quality result. According to the invention the metallic layer is transferred with a pre-determined spread directly or indirectly on to the actual detail with the help of a known printing method. As a printing method can be used, for example, a photographic method in order to produce an exactly shaped picture. This picture is then transferred through etching to the surface on a plate. It can also be transferred to a screen frame. A metallic material is then laid out as a thin layer on the etched plate or pressed through the screen frame out onto a foundation. The now printed metal layer is then collected by a tampon stamp pad which then transfers this to, for example, a casing for a car telephone. Application of this metallic layer according to the invention only takes a few seconds. This must be compared with the vacuum vaporisation method, which is up to now the most successful form, for example car telephone casings, which requires masking devices which are large, clumsy and difficult to handle, and which can only be delivered after several days, which is extremely time-consuming.

Naturally all the surfaces of the metallic layer according to the invention do not have to be tampon printed at the same time. The same detail can be printed more than one rinse in different places. With small series or in the case that the details are small, it is most profitable to use smaller tampon printing pads and printing machines. With large series, and in the case where large bits should be coated, according to the invention, it is more profitable to have less prints per detail with larger pads and larger machines.

BRIEF DESCRIPTION OF THE DRAWINGS

The invention is described more closely below with the help of some preferred examples of embodiments with reference to the appending drawings in which.

DETAILED DESCRIPTION OF THE INVENTION

Figure 1:
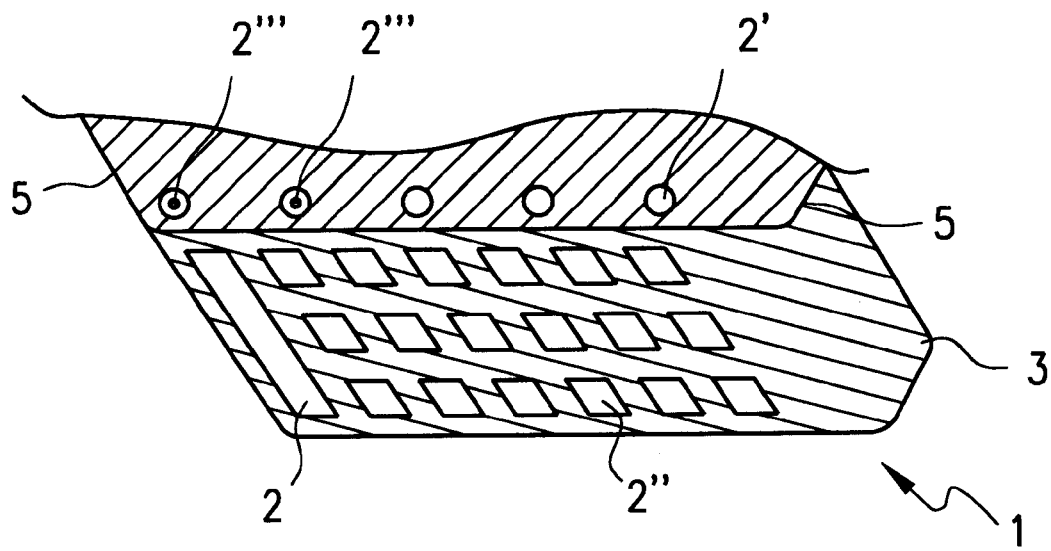
FIG. 1 shows a perspective view obliquely from below of an exemplary tampon printing pad which is coated with an exactly shaped formation of a metallic layer which lays on its surface and which is to be transferred to the casing of, for example, a pocket telephone

The invention is applied according to FIG. 1 by a preferably soft and resilient tampon printing pad having been used in the printing method which is used for the transferring of a metallic layer on to the actual detail 8, which pad 1 has a predetermined tailor-made shape, so that it in the main fits, for example, a casing for a pocket telephone. The tampon printing pad 1 is coated with an electrically conducting metallic layer on its surface 3, which extends on chosen places, thus not too close to a display 2 or interconnection means 2' or too near to the hole edges for the number buttons 2" or where the fittings 2'" are made. This layer 3 is transferred from a preferably etched plate surface. The tampon printing pad 1 can have different shapes with at least one non-flat surface 5 in order to be able to transfer the layer 3 on to different shapes of surfaces which are found in, for example, a detail 8 in the shape of a telephone casing. When the tampon printing pad 1 is pressed against the detail 8, the metallic layer is printed on the predetermined places of the surface of the detail 8.

Figure 2:
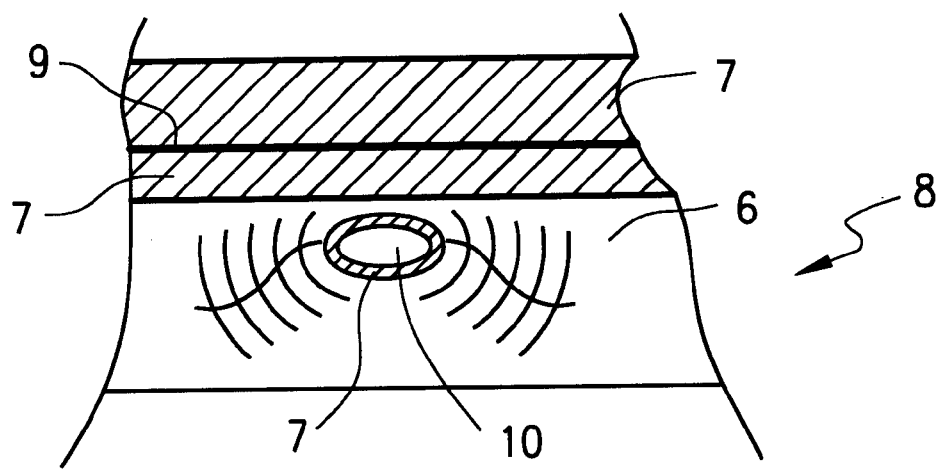
FIG. 2 shows a partial perspective view of an exemplary detail coated with the exact printing pattern of a metallic layer.

FIG. 2 shows how it is possible to apply the invention so that the metallic layer 7 is printed by means of tampon printing pad on to the detail 8, whereby the metallic layer 3 ends up exactly in the chosen positions, which are, for example around a hole 10 in a recess 6 and along an arched edge, where an electrical conductor 9 is to be shielded against electromagnetic radiation. Naturally, the detail 8 can appear in many different ways and be coated with metallic layers 7 of varying shapes and appearances. It is also conceivable than the metallic layer 3 can be transferred to the tampon printing pad 1 in a different way, but preferably from an etched plate surface.

If the metallic layer is transferred with the help of a screen printing method then it can naturally be printed directly onto the detail which shall be provided with this layer without, as is described above, transferring the layer from a screen printed surface with a tampon printing pad.

Though producing the screen frame and its cloth according to the curved surface which is to be coated with a layer, with a predetermined pattern, it is possible to also coat differently shaped surfaces with a layer by screen printing directly onto the detail.

Combinations of the above described printing methods for coating details with a layer which protects against electromagnetic radiation are also possible in order to apply the invention.

The layer coating can also be performed with help of a fluid, for example water, whereby for example a telephone casing which is to be coated, is sunk in a waterbath whereafter the layer is pressed up against the surface of the casing and fixes itself against it. This layer can be produced as a foil and can be connected to a telephone casing which is to be coated before the sinking in the waterbath takes place. In this case the foil fastens on to the telephone casing even if it has curved surfaces.

In the tampon printing method described above, the plate which is provided with the pre-printed picture of electrically conducting paint can be foldable so that during the transferring of the paint to the plate it can have one shape, for example generally flat and when the tampon printing pad is to collect the paint it can have another shape which fits the shape of the tampon printing pad. If the surface such as the interior of a telephone case is curved and complicated then problems occur when printing the metallic layer in the most difficult to approach regions in the nooks and corners of the telephone casing. If the pre-printed plate can be folded so that it is better adapted to the shape of the tampon printing pad then the electrically conducting paint can also more easily be transferred to the intended surfaces on the tampon printing pad even if these are on an extremely curved surface. The metallic print can then be pressed against the telephone casings with curved and complicated shapes.

What is claimed is:

1. A method for applying a layer on a detail having at least one surface, comprising the steps of:

providing a fluidbath having a liquid;

dipping at least the at least one surface of the detail into the liquid of the fluidbath; and applying an electromagnetic shielding layer to the at least one surface of the detail that was dipped into the liquid in said step of dipping using a technique selected from the group consisting of tampon printing, screen printing, and foil fastening.

2. The method according to claim 1, wherein the liquid comprises water.

3. The method according to claim 1, wherein the electromagnetic shielding layer comprises a metallic layer.

4. The method according to claim 1, wherein the detail is comprised of a telephone casing.

5. The method according to claim 1, wherein the detail comprises a portion of a telephone casing.

6. The method according to claim 1, wherein said step of applying the electromagnetic shielding layer to the at least one surface of the detail comprises the step of pressing a tampon printing pad, having the electromagnetic shielding layer thereon, against the at least one surface of the detail to effectuate a tampon printing technique.

7. The method according to claim 1, wherein said step of applying the electromagnetic shielding layer to the at least one surface of the detail comprises the step of transferring the electromagnetic shielding layer onto the at least one surface of the detail using a screen frame and cloth shaped according to the at least one surface of the detail to effectuate a screen printing technique.

8. The method according to claim 1, further comprising the step of:
   disposing a foil substantially against the at least one surface of the detail prior to said step of dipping; and
   wherein said step of applying the electromagnetic shielding layer to the at least one surface of the detail comprises the step of adhering a foil onto the at least one surface of the detail to effectuate a foil fastening technique.

9. A method for placing a layer that shields against electromagnetic radiation on a detail, comprising the steps of:
   providing the detail, the detail having at least one surface;
   providing a tampon printing pad that is adapted to approximately conform to a shape of the at least one surface of the detail;
   applying the layer to the tampon printing pad; and
   transferring the layer from the tampon printing pad to the at least one surface of the detail.

10. The method according to claim 9, wherein the layer comprises a metallic layer.

11. The method according to claim 9, wherein the tampon printing is comprised of a complaint material.

12. The method according to claim 9, wherein said step of applying a layer to the tampon printing pad comprises the step of transferring the layer to the tampon printing pad from a surface that is etched or screen printed.

13. The method according to claim 12, wherein the surface that is or screen printed is flexible so as to facilitate the transfer of the layer from the surface to the tampon printing pad.

14. The method according to claim 9, wherein the detail comprises at least a portion of a telephone casing.

15. A method for placing a metallic layer that shields against electromagnetic radiation on a detail, comprising the steps of:
   providing the detail, the detail having at least one surface;
   providing a tampon printing pad that is adapted to approximately conform to a shape of the at least one surface of the detail;
   applying the metallic layer to the tampon printing pad; and
   transferring the metallic layer from the tampon printing pad to the at least one surface of the detail.

16. A method for placing a layer that shields against electromagnetic radiation on a detail, comprising the steps of:
   providing the detail, the detail having at least one surface;
   providing a tampon printing pad that is comprised of a complaint material and is adapted to approximately conform to a shape of that at least one surface of the detail;
   applying the layer to the tampon printing pad; and
   transferring the layer from the tampon printing pad to the at least one surface of the detail.

17. A method for applying a layer that shields against electromagnetic radiation on at least one portion of a telephone casing, comprising the steps of:
   providing at least one surface of the at least one portion of the telephone casing;
   providing a tampon printing pad that is adapted to approximately conform to a shape of the at least one surface of the at least one portion of the telephone casing;
   applying the layer to the tampon printing pad; and
   transferring the layer from the tampon printing pad to the at least one surface of the at least one portion of the telephone casing.

18. The method according to claim 17, wherein said step of applying the layer to the tampon printing pad comprises the steps of:
   producing a plate etched with a picture that approximately reflects the at least one surface of the at least one portion of the telephone casing;
   placing the layer on the etched plate; and
   collecting the layer from the etched plate with the tampon printing pad.

19. The method according to claim 18, wherein said step of applying the layer to the tampon printing pad further comprises, prior to said step of collecting the layer from the etched plate with the tampon printing pad, the step of:
   folding the etched plate to approximately fit a shape of the tampon printing pad.

20. The method according to claim 17, wherein said step of applying the layer to the tampon printing pad comprises the steps of:
   providing a screen frame that secures a cloth, the cloth including a picture that approximately reflects the at least one surface of the at least one portion of the telephone casing;
   pressing the layer through the cloth of the screen frame onto a foundation; and
   collecting the layer from the foundation with the tampon printing pad.

21. The method according to claim 17, wherein said step of transferring the layer from the tampon printing pad to the at least one surface of the at least one portion of the telephone casing comprises the step of:
   repeatedly pressing the tampon printing pad against respective different parts of the at least one surface of the at least one portion of the telephone casing.

22. The method according to claim 17, wherein the layer comprises a metallic layer.

23. The method according to claim 17, wherein the tampon printing pad is comprises of a complaint material.

24. A method for applying a metallic layer that shields against electromagnetic radiation on at least one portion of a telephone casing, comprising the steps of:
   providing at least one surface of the at least one portion of the telephone casing;
   providing a tampon printing pad that is adapted to approximately conform to a shape of the at least one surface of the at least one portion of the telephone casing;
   applying the metallic layer to the tampon printing pad; and
   transferring the metallic layer from the tampon printing pad to the at least one surface of the at least one portion of the telephone casing.

25. A method for applying a layer that shields against electromagnetic radiation on at least one portion of a telephone casing, comprising the steps of:

provic ing at least one surface of the at least one portion of the telephone casing;

providing a tampon printing pad that is comprised of a complaint material and is adapted to approximately conform to a shape of the at least one surface of the at least one portion of the telephone casing;

applying the layer to the tampon printing pad; and transferring the layer from the tampon printing pad to the at least one surface of the at least one portion of the telephone casing.

* * * * *

UNITED STATES PATENT AND TRADEMARK OFFICE
CERTIFICATE OF CORRECTION

PATENT NO. : 6,200,630 B1
DATED : March 13, 2001
INVENTOR(S) : Eriksson

It is certified that error appears in the above-identified patent and that said Letters Patent is hereby corrected as shown below:

<u>Title page,</u>
Item [73], Assignee, after "Ericsson" insert -- (publ) --

<u>Column 1,</u>
Line 23, replace "or" with -- of --
Line 24, replace "complains" with -- complaints --
Line 66, replace "add" with -- adds --

<u>Column 2,</u>
Line 15, replace "them" with -- then --

<u>Column 3,</u>
Line 17, replace "rinsc" with -- time --
Line 21, delete "where"

<u>Column 4,</u>
Line 2, replace "than" with -- that --
Line 10, replace "Though" with -- Through --
Line 43, replace "print" with -- paint --

<u>Column 5,</u>
Line 34, replace "complaint" with -- compliant --
Line 63, replace "that" with -- the --

<u>Column 6,</u>
Line 52, replace "comprises" with -- comprised --
Line 52, replace "complaint" with -- compliant --

UNITED STATES PATENT AND TRADEMARK OFFICE
CERTIFICATE OF CORRECTION

PATENT NO.    : 6,200,630 B1
DATED         : March 13, 2001
INVENTOR(S)   : Eriksson It is certified that error appears in the above-identified patent and that said Letters Patent is hereby corrected as shown below:

<u>Column 7,</u>
Line 7, replace "complaint" with -- compliant --

Signed and Sealed this

Eighth Day of April, 2003

JAMES E. ROGAN
*Director of the United States Patent and Trademark Office*